US007786826B2

(12) United States Patent
Thalhammer et al.

(10) Patent No.: US 7,786,826 B2
(45) Date of Patent: Aug. 31, 2010

(54) APPARATUS WITH ACOUSTICALLY COUPLED BAW RESONATORS AND A METHOD FOR MATCHING IMPEDANCES

(75) Inventors: Robert Thalhammer, Munich (DE); Martin Handtmann, Munich (DE); Jyrki Kaitila, Riemerling (DE); Winfried Nessler, Munich (DE); Lueder Elbrecht, Munich (DE)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 140 days.

(21) Appl. No.: 11/871,665

(22) Filed: Oct. 12, 2007

(65) Prior Publication Data
US 2009/0096549 A1    Apr. 16, 2009

(51) Int. Cl.
*H03H 9/54* (2006.01)
*H03H 7/38* (2006.01)
(52) U.S. Cl. .................... 333/189; 333/32; 310/334; 310/335
(58) Field of Classification Search ............... 333/187, 333/189, 133, 32; 310/334, 335
See application file for complete search history.

(56) References Cited

U.S. PATENT DOCUMENTS

| 5,382,930 | A | * | 1/1995 | Stokes et al. ................ 333/191 |
| 5,821,833 | A |   | 10/1998 | Lakin |
| 6,670,866 | B2 | * | 12/2003 | Ella et al. .................... 333/133 |
| 6,720,844 | B1 |   | 4/2004 | Lakin |
| 6,933,807 | B2 |   | 8/2005 | Marksteiner et al. |
| 6,946,928 | B2 |   | 9/2005 | Larson, III et al. |
| 6,963,257 | B2 | * | 11/2005 | Ella et al. .................... 333/133 |
| 7,019,605 | B2 | * | 3/2006 | Larson, III .................. 333/187 |
| 7,075,214 | B2 | * | 7/2006 | Inoue et al. .................. 310/328 |
| 7,173,504 | B2 |   | 2/2007 | Larson, III et al. |
| 7,212,083 | B2 |   | 5/2007 | Inoue et al. |
| 7,310,861 | B2 | * | 12/2007 | Aigner et al. ............... 29/25.35 |
| 7,414,495 | B2 | * | 8/2008 | Iwasaki et al. .............. 333/133 |
| 7,479,851 | B2 | * | 1/2009 | Aigner et al. ............... 333/189 |
| 7,548,139 | B2 | * | 6/2009 | Park et al. .................... 333/187 |
| 2004/0046622 | A1 |   | 3/2004 | Aigner et al. |
| 2004/0150293 | A1 |   | 8/2004 | Unterberger |
| 2004/0201305 | A1 | * | 10/2004 | Aigner et al. ............... 310/311 |
| 2005/0093652 | A1 | * | 5/2005 | Ma et al. ..................... 333/187 |
| 2005/0093656 | A1 |   | 5/2005 | Larson, III et al. |
| 2005/0128030 | A1 |   | 6/2005 | Larson, III et al. |
| 2006/0091978 | A1 | * | 5/2006 | Wang et al. .................. 333/189 |
| 2006/0205361 | A1 |   | 9/2006 | Ruby et al. |
| 2007/0120624 | A1 | * | 5/2007 | Milsom et al. .............. 333/189 |
| 2007/0176710 | A1 | * | 8/2007 | Jamneala et al. ............ 333/191 |

FOREIGN PATENT DOCUMENTS

EP            1 317 797 B1    6/2003

OTHER PUBLICATIONS

Kaitila, J., et al., "Spurious Resonance Free Bulk Acoustic Wave Resonators," 2003 IEEE Symposium on Ultrasonics, Oct. 5-8, 2003, pp. 84-87, vol. 1, IEEE.

\* cited by examiner

*Primary Examiner*—Barbara Summons (57) ABSTRACT

An apparatus includes a first bulk acoustic wave (BAW) device including a first impedance and a second BAW device including a second impedance, wherein the first and second impedances are different and the first and second BAW devices are acoustically coupled.

22 Claims, 8 Drawing Sheets

FIG 1

Prior Art

FIG 2

Prior Art

APPARATUS WITH ACOUSTICALLY COUPLED BAW RESONATORS AND A METHOD FOR MATCHING IMPEDANCES

BACKGROUND

Embodiments of the present invention relate to an apparatus with acoustically coupled Bulk Acoustic Wave (BAW) resonators and to impedance transformations among devices.

SUMMARY OF THE INVENTION

Embodiments of the present invention relate to an apparatus, comprising a first bulk acoustic wave (BAW) device with a first impedance and a second BAW device comprising a second impedance, wherein the first and second impedances are different and the first and second BAW devices are acoustically coupled.

BRIEF DESCRIPTION OF THE DRAWINGS

Embodiments of the present invention will be explained in the following with reference to the accompanying drawings, in which.

Before embodiments of the present invention will be explained in greater detail in the following on the basis of the drawings, it is pointed out that like elements in the figures are provided with the same or similar reference numerals, and that repeated description of these elements is omitted.

DETAILED DESCRIPTION OF ILLUSTRATIVE EMBODIMENTS

In high-frequency applications, so-called surface acoustic wave filters (SAWs) presently are often employed as bandpass filters as a classic solution, showing a steep roll-off. Moreover, so-called bulk acoustic wave resonators (BAWs) or filters comprising BAW resonators (BAW filters) have been utilized recently as a further solution. One main field of application of these filters, in particular, concerns their employment in mobile telephones.

SAW filters allow for impedance transformation between an input and an output signal with almost arbitrary transformation ratios, without substantial technical overhead being required for this. This represents an important technological advantage. Moreover, they enable executing transformations from a single-ended signal to a balanced signal (s-b), again with no substantial technical overhead being necessary for this. Technical disadvantages of the SAW filters, however, consist in their quality (insertion loss) and the flank steepness.

In general, these quantities are worse than in the BAW filters. Moreover, the power compatibility of the SAW filters is worse than in the BAW filters, this can be seen particularly with increasing frequency.

On the other hand, BAWs or BAW filters are technically advantageous with respect to their quality and the flank steepness and are furthermore also significantly more power compatible than is the case with SAW filters. However, it is technically disadvantageous in BAWs that impedance transformations within the filter are not possible, and/or only a little mismatch enables a match of impedance ratios to lie close to the ratio of 1:1, and this is always connected with performance degradation. Moreover, a single-to-balanced conversion (s-b) within a BAW filter is not possible and can only be realized by expensive and performance-reducing external components.

Coupled resonator filters (CRF) are a further development of the BAWs comprising at least two acoustically coupled BAW resonators in a stacked arrangement. The technical advantages of the BAWs, particularly the quality and power compatibility, are maintained and further supplemented by the possibility of a conversion of a single to a balanced signal within the filter. A disadvantage of BAWs is compensated for therewith.

Furthermore, CRFs allow for impedance transformations for specific transformation ratios, without a mismatch or without external components. This is the case, e.g., for the ratio of 1:4 (or its inverse 4:1). To this end, a 2-stage CRF is used, the input and output stages of which are each formed by two BAW resonator stacks. For the conversion mentioned, all four resonators have the same impedance (Z0), in order to guarantee optimum electrical and acoustical matching. In one stage (e.g., at the input), the two stacks are connected in series, so that the impedances add up to 2*Z0, and in the other stage (e.g., at the output) the two stacks are connected in parallel, so that both admittances add to an overall impedance of Z0/2. Thus, the transformation ratio of 1:4 results. By exchanging input and output, it is obvious that a transformation ratio of 4:1 also can be realized in similar manner, and multiples of these transformation ratios (such as 1:16 or 16:1) can be realized by connecting several such devices one behind the other.

It is a substantial disadvantage of CRFs, however, that arbitrary impedance transformation ratios cannot be achieved at present. On the other hand, however, modern CDMA telephones (band 1, CDMA=Code Division Multiple Access) require a transformation from 50 ohms to 100 ohms, for example, in the duplexer RX filter, which corresponds to a transformation ratio of 1:2, and which is not achievable with CRFs in the way as they are described above.

In conventional solutions, impedance transformations previously could only be realized by means of external components for BAWs/CRFs. These external components, for example, included coils and capacitors as well as external transformers. As the only exceptions, with CRFs, the specific impedance transformation ratios described above have been achievable previously. The external components, however, require space and create additional losses, thus they lead to an increase in the insertion loss. Moreover, they frequently represent additional relevant cost increase. Hence, SAWs, which however, as already mentioned, generally do not offer the demanded flank steepness, quality and power compatibility, previously have been employed for such applications as the single alternative.

Especially for application in duplexers for CDMA mobile telephones, at present there are only relatively expensive, large components, which comprise all technically required features. The assessment with respect to the size and the price (large and expensive) is always made in comparison with interstage filters or GSM filters, for example. These alternatives do not require all four of the above-mentioned properties at the same time and thus can be realized more easily and/or more inexpensively. Apart from the CDMA technology, however, there are further fields of application that make inexpensive technical realization of all described features seem desirable.

Hence, there is a need for devices and/or for a circuit or a production process to enable the attainment of arbitrary impedance transformation ratios with CRFs, whereby the great technical disadvantage of BAWs/CRFs as opposed to SAWs would also be compensated for. Thus, concurrent conversion of single-ended input to balanced-ended output as well as a transformation of an input impedance Zin to an output impedance Zout would be possible.

Since the coupling between an input signal and an output signal in CRFs is of an acoustic nature, they allow for signal transformation from single-ended input to a balanced output without effort.

Embodiments of the present invention describe an apparatus comprising a first BAW device and a second BAW device, wherein the first BAW device has a first impedance and the second BAW device a second impedance, and the first and second impedances being different, and wherein the first and second BAW devices are acoustically coupled. The first and second BAW devices may, for example, comprise BAW resonators, wherein each BAW resonator comprises a piezoelectric layer sandwiched between a first and second electrode. The sandwich structure thus obtained extends over a resonator area laterally along the piezoelectric layer. Furthermore, the piezoelectric layer comprises a certain layer thickness.

In further embodiments, the first BAW device is a first BAW resonator and the second BAW device a second BAW resonator, wherein the first piezoelectric layer of the first BAW resonator and the second piezoelectric layer of the second BAW resonator have different layer thicknesses. The different layer thicknesses here cause the different impedances of the first BAW resonator and of the second BAW resonator. In further embodiments, the first BAW resonator has a first resonator area and the second BAW resonator a second resonator area, wherein the first and second resonator areas differ from each other. In another embodiment, the first and second BAW resonators use piezoelectric materials with different dielectric constant epsilon, and comprise different impedances. A combination of the three options, i.e., using BAW resonators comprising different piezoelectric layer thicknesses, different resonator areas or different piezoelectric materials is also possible.

Furthermore, the first BAW resonator and the second BAW resonator may be coupled acoustically by a coupling layer structure, wherein the coupling layer structure defines the acoustic coupling on the one hand and may adapt or balance a possible area difference of the first resonator area and of the second resonator area on the other hand. The acoustic coupling may, for example, be adjusted so that a predetermined filter characteristic results. The adaptation or the balance of the area differences, in further embodiments, may take place such that the coupling layer structure is formed as a Fresnel lens, that is, e.g., that the coupling layer structure has an alternating layer sequence of materials with high and low acoustic impedances, and the layers with high acoustic impedance may have openings formed such that increasing openings are formed with increasing distance from a center of the layer. The adaptation described thus causes the wave front of the acoustic wave to be distributed to the resonator areas as evenly as possibly and with as few losses as possible to occur between acoustically coupled resonators.

In further embodiments, the first and second BAW resonators form a first CRF stage, which is electrically coupled to a second CRF stage, wherein the second CRF stage may again comprise two BAW resonators, a third and a fourth BAW resonator, and the third and fourth BAW resonators may comprise different impedances and are acoustically coupled. The different impedances of the BAW resonators of the second CRF stage may, for example, again be caused by piezoelectric layers of different layer thickness as well as by different resonator areas of the two BAW resonators or of different piezoelectric materials with different dielectric constants of the second CRF stage.

The first and second CRF stages can be formed such that a first impedance jump occurs between the first and second BAW resonators of the first CRF stage, a second impedance jump occurs between the second BAW resonator of the first CRF stage and the third BAW resonator of the second CRF stage and a third impedance jump between the third and fourth BAW resonators of the second CRF stage. Further impedance jumps may, for example, occur when the two coupled CRF stages are connected between an output of an upstream device and an input of a downstream device. Thus, at the input of the two CRF stages and at the output of the two CRF stages, further impedance jumps may occur, the height of which also depends on the upstream and downstream devices.

In this example, hence, five impedance jumps occur, which may, for example, be distributed such that each impedance jump is equally large. Moreover, the impedance jumps may be optimized in that reflections of a signal propagation from the input to the output of the two CRF stages as a result of the impedance jumps are minimized, and thus an insertion loss is optimized.

Thus, the impedance mismatch can be distributed to the following five interfaces:

an electrical coupling (e.g. to an upstream device) at the input to the first BAW resonator of the first CRF stage;

the acoustic coupling from the first to the second BAW resonators of the first CRF stage;

the electrical coupling from the second BAW resonator of the first CRF stage to the third BAW resonator of the second CRF stage;

the acoustic coupling from the third to the fourth BAW resonator of the second CRF stage, and the electrical coupling of the second BAW resonator of the second CRF stage at the output (e.g., to a downstream device).

Impedance jumps always imply performance degradation (a degradation of the insertion loss). Since the performance degradation depends on the impedance mismatch in a non-linear manner, the entire performance degradation, which develops through the stepwise impedance jumps at every step, is lower than the performance degradation if the entire impedance mismatch occurred at one step. Several smaller impedance jumps thus prove less disadvantageous in the insertion loss than a great impedance jump, even if the entire impedance difference is the same.

The impedance transformations or the impedance jumps in points (2) and (4), apart from the different resonator areas mentioned, as already stated, may be brought about by different layer thicknesses of the piezoelectric layers yielding different capacitances. In order to avoid that the impedance transformations in point (2) and point (4) cancel each other out in this case, cross-wise connection may become necessary. This may, for example, be the case if the corresponding BAW resonators are arranged on a layer stack of two piezoelectric layers. For example, if two of the four BAW resonators each share a piezoelectric layer, or more specifically are formed at different sites of the piezoelectric layer in the form of a sandwich structure. A cross-wise connection, however, is disadvantageous in that, for the connection of the bottom resonator in the first CRF stage with the top resonator in the second CRF stage, vias may be necessary, which in turn may make the production process significantly more intensive and thus also more expensive. The differentiation between the top and bottom resonators is always possible if the CRF stages are arranged on one substrate, so that, e.g., those BAW resonators arranged between the substrate and further BAW resonators can be referred to as bottom BAW resonators. Correspondingly, BAW resonators separated from the substrate by other BAW resonators are referred to as top BAW resonators.

As far as these vias are undesirable and/or too expensive, the impedance transformations in the acoustic coupling within one CRF stage can be realized by different areas, as described above. Since the resonator area is determined by the design, a desired impedance transformation can be combined with any connection. In particular, a potentially needed cross-wise connection of the two stages is omitted. A realization of impedance transformations by means of different resonator areas can be realized with a standard connection, i.e., it does not require any vias and thus is significantly simplified with respect to the production process. So as to achieve the impedance transformations in this possibility, both (BAW) resonators of one CRF stage are made differently large, and thus a step-wise impedance transformation is realized. But if the sizes (of the resonator areas) of the resonators strongly differ from each other, the acoustic coupling is significantly disturbed, so that the CRF-typical characteristic can no longer develop. This can be prevented by applying one of the following principles:

It is worked with slight area differences, that the overhang with which the larger resonator (having the larger resonator area) protrudes over the smaller resonator is of an order of magnitude of the characteristic length. For example, the area difference can agree with a square of the characteristic length to an accuracy of, e.g., 50%, or the ratio of the area differences and the square of the characteristic length is between 0.5 to 1.5. The characteristic length is that length quantity with which the acoustic wave dies off laterally (i.e., along the resonator area). This may, for example, be the lateral distance at which the amplitude of the acoustic wave has fallen to a predetermined proportion (e.g., to $1/10$ or $1/e$; e=Euler number). The characteristic length may be adjusted by suitable choice of the dispersion of the layer stack and by special edge structures within certain boundaries. For example, a region can be formed along the edge of a resonator area and in the region at least one of the two electrodes of the corresponding BAW resonator comprises a different layer thickness. This region can then be optimized with respect to its width and (electrode) thickness such that the acoustic wave increasingly dies off in lateral direction.

Between the two resonators of one CRF stage, there is a series of coupling layers (or a coupling layer structure) with alternating low and high acoustic impedances, wherein the layers with high acoustic impedance can be structured laterally such that they form a Fresnel lens so that the wave generated by the smaller resonator is projected onto the larger resonator. Of course, the same also applies in reverse order, so that an acoustic wave from the resonator with larger area is focused onto a resonator with smaller area.

Alternatively, as already described, different impedances or impedance jumps between acoustically coupled BAW resonators can be generated or adapted by making the top and bottom piezoelectric layers of the two CRF stages differently thick. This entails that part of the BAW resonators (for example the upper one) has another electric impedance than other BAW resonators (for example the lower one). Thus, the CRF stack performs, in operation, an impedance transformation for signals propagating between an input and an output. For example, terminals of an upper BAW resonator may provide a signal input and terminals of a lower BAW resonator a signal output.

The design of the piezoelectric layers with different layer thicknesses may necessitate the aforementioned crossing out of the electrical connection of the two resonators of a two-stage CRF. By crossing out, the transformation ratio of the first stage and of the second stage adds or actually multiplies and does not cancel out again. Thus, the acoustic impedance transformation, which the device performs, can be utilized. The crossing out is important, in particular, if the top resonators of the first and second CRF stacks (CRF stage) and the bottom BAW resonators of the first and second CRF stacks each share a piezoelectric layer, and both piezoelectric layers have a different layer thickness. In a conventional circuit, in which the two bottom resonators would be connected to each other, the transformation of the second CRF stack would again cancel out that of the first CRF stack. At the same time, by these two measures (other layer thicknesses and crossing out), the number of degrees of freedom available for the optimization of the matching for impedance transformations is increased. Thus, a better CRF with integrated impedance transformation can be constructed at approximately an equal effort.

The impedance transformation might be done without crossing out, if at the same time the resonator areas of the BAW resonators of the second CRF stage are changed correspondingly. An impedance transformation or jump of a BAW resonator may also be made through a change of the material, e.g., the piezoelectric layer. For example, it is possible to use, for the first piezoelectric layer, a material with another ∈-value (dielectric constant) than for the second piezoelectric layer.

Embodiments of the present invention thus offer the possibility of realizing a circuit and/or a production method for CRFs, with which it is possible to expand the fixed discrete transformation ratios 4:1, 1:1, 1:4 . . . , which are already achieved in conventionally connected CRFs, so far that the ratios overlap and arbitrary impedance transformation ratios can thus be achieved with the aid of CRFs. Further advantages of embodiments of the present invention are given by the fact that such a (2-stage) CRF meets all requirements for filters in a device at the same time. Such a CRF, in particular, meets the requirements for quality, flank steepness, power compatibility, single-to-balanced conversion, impedance transformations, and without requiring external components, such as LC-elements, balloons, etc. Hence, embodiments of the present invention are optimum solutions for technically challenging applications, such as, but not exclusively, in duplexers, with reference to the costs, the space requirement and the performance.

Furthermore, embodiments are advantageous in that a required impedance jump can be distributed to several sites (for example, five instead of three), wherein an otherwise equal device design with equal device size can be used and only slightly increased production costs arise, such as by the design of additional processing levels for additional contact vias. The strategy thus chosen is successful because the performance degradation depends on the impedance ratio at the jump site in a strongly non-linear manner. For example, two jump sites with an impedance ratio of 1:1.2 at each jump mean less losses due to the non-linearity than one jump site with an impedance ratio of 1:(1.2)2=1:1.44. Thus, embodiments allow for better matching, and the device has better performance, and hence less insertion loss and less return loss.

Figure 1:
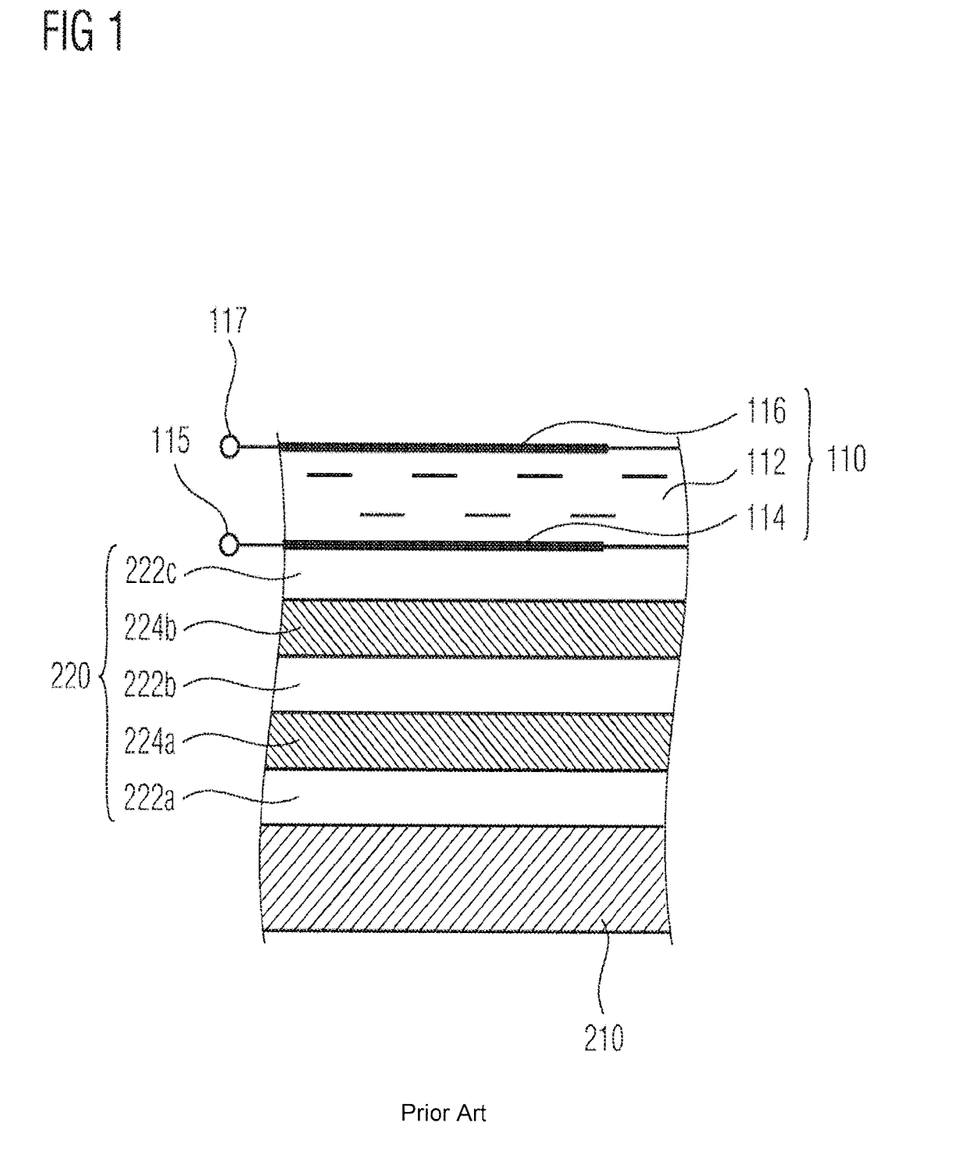
FIG. 1 shows a conventional BAW resonator on a substrate with an acoustic mirror.

FIG. 1 shows a cross-sectional view of a BAW resonator 110 with a piezoelectric layer 112 arranged between a first electrode 114 and a second electrode 116. The first electrode 114 is connected to a first terminal 115, and the second electrode 116 is connected to a second terminal 117. The BAW resonator 110 is formed on a substrate 210, wherein an acoustic mirror 220 is formed between the substrate 210 and the BAW resonator 110. The acoustic mirror, for example, comprises a layer sequence of alternating materials with high and low acoustic impedances. In the example shown in FIG. 1, the acoustic mirror 220 comprises three layers with low acoustic impedance, a first layer with low acoustic impedance 222a, a second layer with low acoustic impedance 222b and a third layer with low acoustic impedance 222c. Furthermore, in the example of FIG. 1, the acoustic mirror 220 comprises two layers with high acoustic impedance, a first layer with high acoustic impedance 224a and a second layer with high acoustic impedance 224b.

The sandwich structure, formed of the piezoelectric layer 112 and the first electrode 114 and the second electrode 116, extends over a resonator area (extending perpendicularly to the drawing plane and not visible in the cross-sectional view), and the piezoelectric layer 112 comprises a predetermined layer thickness, wherein the predetermined layer thickness, for example, is chosen to yield resonator properties (for example, frequency behavior). The conventional BAW resonator of FIG. 1 represents a solidly mounted resonator, whereas in further embodiments the BAW resonator 110 may comprise an air interface on both sides, so that no acoustic mirror is required. In general, the piezoelectric layers comprise a layer sequence of a plurality of (piezoelectrically active and non-active) layers. Likewise, the first and second electrodes may comprise a layer sequence.

Figure 2:
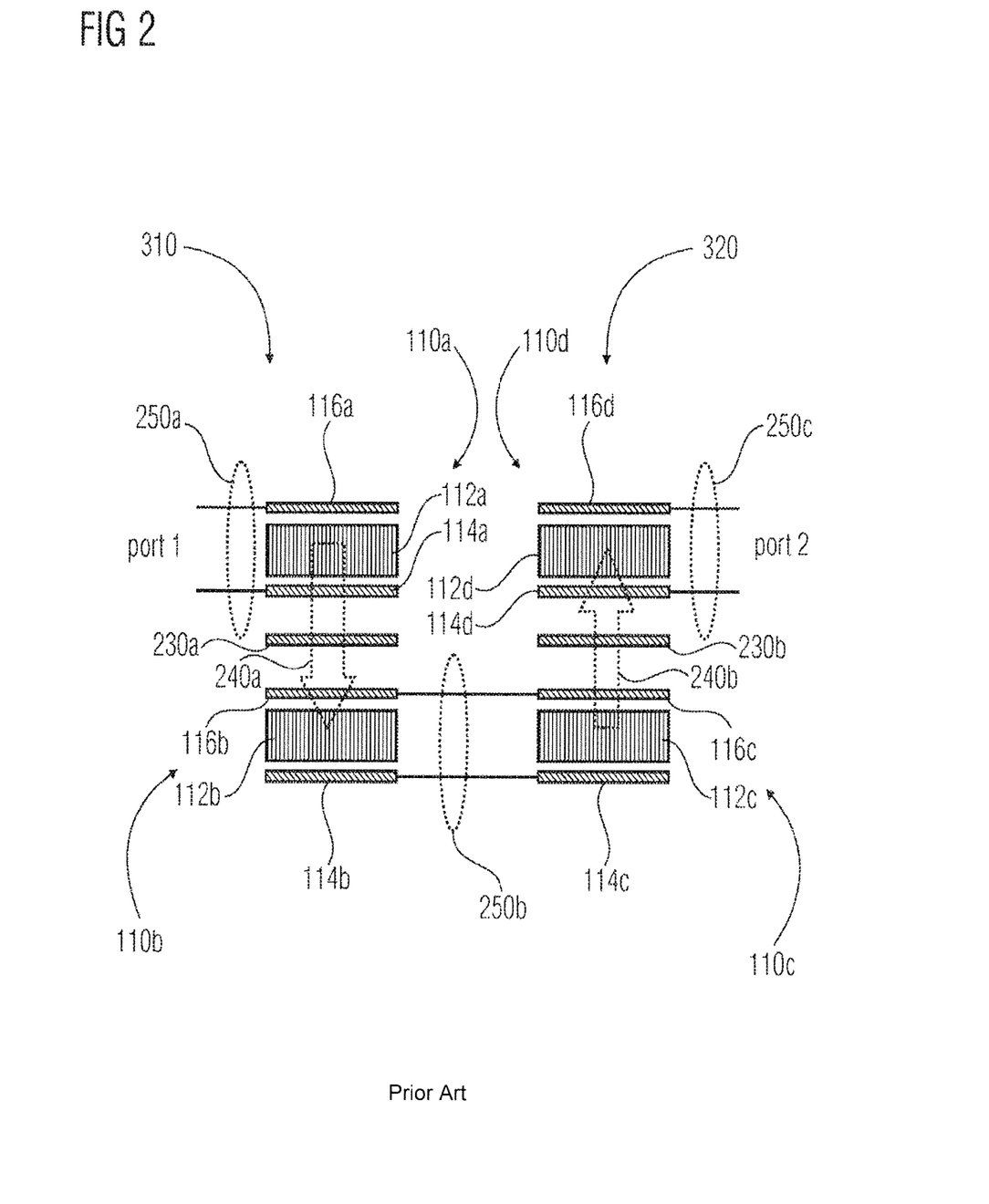
FIG. 2 shows a conventional coupling between two coupled resonator filter stages.

FIG. 2 shows a coupling of a first conventional CRF 310 to a second conventional CRF 320, wherein the first and second conventional CRFs 310 and 320 comprise piezoelectric layers at equal layer thickness, and a first BAW resonator 110a, a second BAW resonator 110b, a third BAW resonator 110c and a fourth BAW resonator 110d with equal resonator areas as BAW resonators.

In this conventional device, the first port (port 1) is coupled to the first BAW resonator 110a, and the first BAW resonator 110a acoustically couples via a first acoustic coupling structure 230a to the second BAW resonator 110b, which in turn is electrically coupled to the third BAW resonator 110c. The third BAW resonator 110c is in turn acoustically coupled to the fourth BAW resonator 110d via a second coupling structure 230b. Each of the first, second, third and fourth BAW resonators 110a, 110b, 110c and 110d comprises a piezoelectric layer 112, which is arranged between the first electrode 114 and the second electrode 116. In this conventional device, impedance jumps can only occur between the first CRF 310 and the second CRF 320 through the electric coupling 250b. Moreover, impedance jumps may occur when the first port and the second port (port 2) are coupled to devices with different impedance. These further impedance jumps may also occur in a first electric coupling 250a and a second electric coupling 250c.

A signal flow may happen such that an input signal is present at the port 1 and converted, in the first BAW resonator 110a, into an acoustic signal reaching the second BAW resonator 110b via the first acoustic coupling structure 230a and generating a further electric signal there, which in turn reaches the third BAW resonator 110c via the electric coupling 250b, where it is in turn converted into an acoustic signal that is in turn transmitted to the fourth BAW resonator 110d via the second acoustic coupling structure 230b. There, an electric output signal is present at the port 2.

This may also be illustrated schematically as follows:
Signal In→Top R1→Bottom R1→Bottom R2→Top R2→Signal Out Here and in the following, the first CRF stage or the first resonator stack (input resonator) also is designated with R1, and the second CRF stage or the second resonator stack (output resonator) with R2, wherein the input and output resonators may also be exchanged.

A signal transmission leaving the path shown in FIG. 2 may, for example, be suppressed by the second BAW resonator 110b and the third BAW resonator 110c being formed on a substrate 210 with an acoustic mirror 220 and the acoustic mirror 220 being designed, like in FIG. 1, such that propagation of an acoustic wave into the substrate 210 is suppressed, on the one hand. On the other hand, acoustic propagation of a signal from the first BAW resonator 110a and the fourth BAW resonator 110d in a direction opposite to the substrate 210 can be avoided by an air interface being formed above (that is, on the side facing away from the substrate 210) the first BAW resonator 110a and the fourth BAW resonator 110d.

Figure 3:
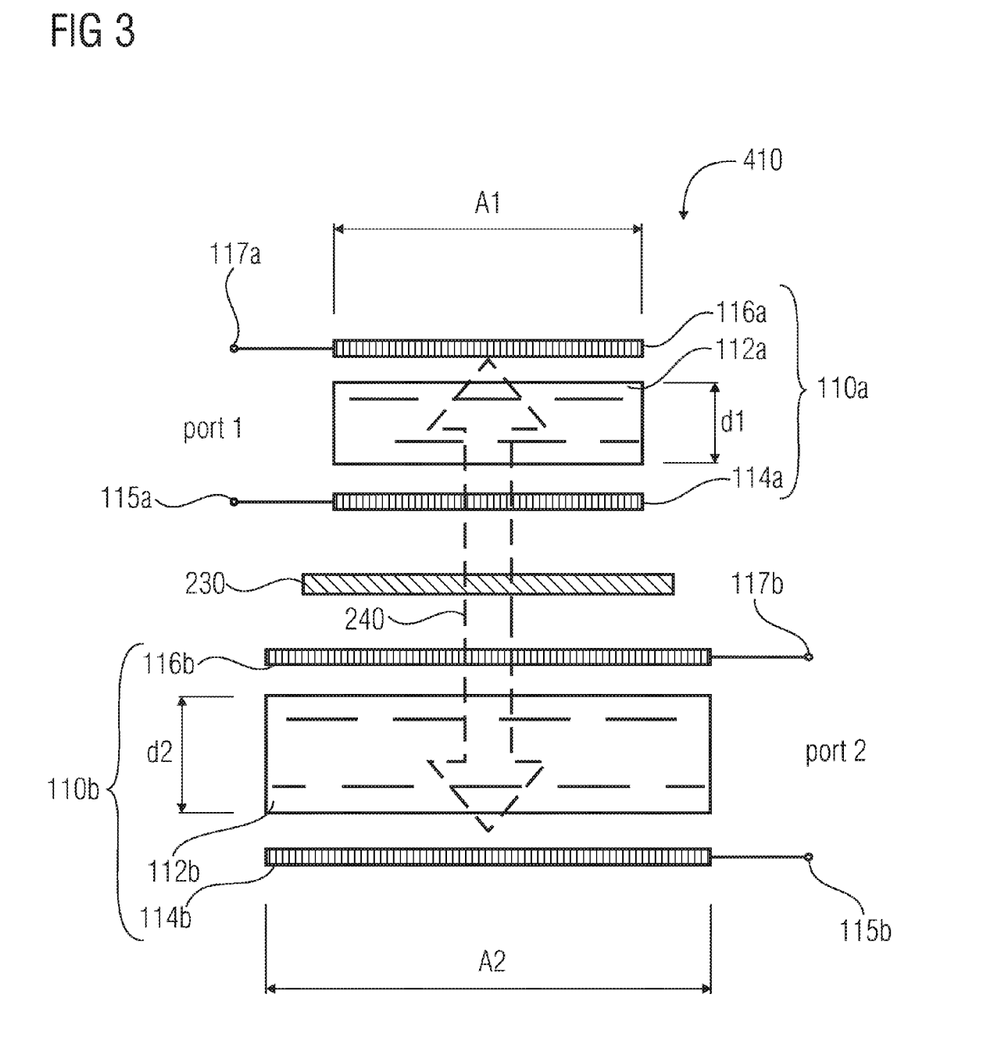
FIG. 3 shows acoustically coupled BAW resonators with different impedances according to one embodiment of the present invention.

FIG. 3 shows an embodiment of the present invention with a first BAW resonator 110a and a second BAW resonator 110b, which are acoustically coupled and form a coupled resonator filter 410. An acoustic coupling 240 here is defined by a coupling structure 230, wherein the coupling structure 230 may comprise, similar to the acoustic mirror 220, a layer sequence of layers with different acoustic impedances (alternating series with high and low acoustic impedances). In the embodiment of FIG. 3, the first BAW resonator 110a comprises a first piezoelectric layer 112a with a layer thickness d1, which is formed between a first electrode 114a and a second electrode 116a on a first area A1. The first electrode 114a of the first BAW resonator 110a is connected to a first terminal 115a, and the second electrode 116a of the first BAW resonator 110a is connected to a second terminal 117a. The first and second terminals 115a and 117a form a first port (port 1). The second BAW resonator 110b comprises a second piezoelectric layer 112b with a layer thickness d2, which is arranged between a first electrode 114b and a second electrode 116b on a second area A2. The first electrode 114b of the second BAW resonator 110b is connected to a first terminal 115b, and the second electrode 116b of the second BAW resonator 110b is connected to a second terminal 117b, wherein the first and second terminals 115b and 117b of the second BAW resonator 110b form a second port (port 2).

The layer thickness d1 of the first piezoelectric layer 112a and the layer thickness d2 of the second piezoelectric layer 112b may comprise different values, and the first resonator areas A1 of the first BAW resonator 110a and the second resonator area A2 of the second BAW resonator 110b may also comprise values different from each other.

The impedance of the first BAW resonator 110a is given, among other things, by the layer thickness d1 of the piezoelectric layer 112a and by the first resonator area A1. Likewise, the impedance of the second BAW resonator 110b is given, among other things, by the layer thickness d2 of the second piezoelectric layer 112b as well as by the second resonator area A2 of the second BAW resonator 110b. Furthermore, the impedances of the first and second BAW resonators 110a and 110b depend on the piezoelectric material used for the respective piezoelectric layer. Since the layer thickness values d1 and d2 of the piezoelectric layers of the first and second BAW resonators 110a and 110b, as well as the resonator areas A1 and A2, may have values different from each other, an impedance jump occurs in the transmission of a signal from port 1 to port 2 (or in reverse direction) at the transition of the signal from the first BAW resonator 110a to the second BAW resonator 110b. Further impedance jumps may occur, for example, when an electrical device the impedance of which differs from that of the first BAW resonator 110a is attached at port 1, and a third impedance jump may similarly occur when an electric device the impedance of which differs from that of the second BAW resonator 110b is attached at port 2.

In order to have as little losses as possible in the acoustic transmission of the signal energy from the first BAW resonator 110a to the second BAW resonator 110b (or vice versa), the coupling layer 230 is designed in suitable manner. The suitable design is chosen such that energy propagation in a lateral direction, and hence in parallel to the resonator area, is suppressed as much as possible, so that the acoustic wave substantially propagates only in the sectional plane (and not in a lateral direction). This propagation direction is indicated by the arrow of the acoustic coupling 240. In the CRF 410, hence an electric signal, which is present at the port 1 in the first BAW resonator 110a, for example, is converted into an acoustic signal propagating to the second BAW resonator 110b as a result of the acoustic coupling 240 and generating an electric output signal, which is present at the port 2, in the second BAW resonator 110b.

Figure 4:
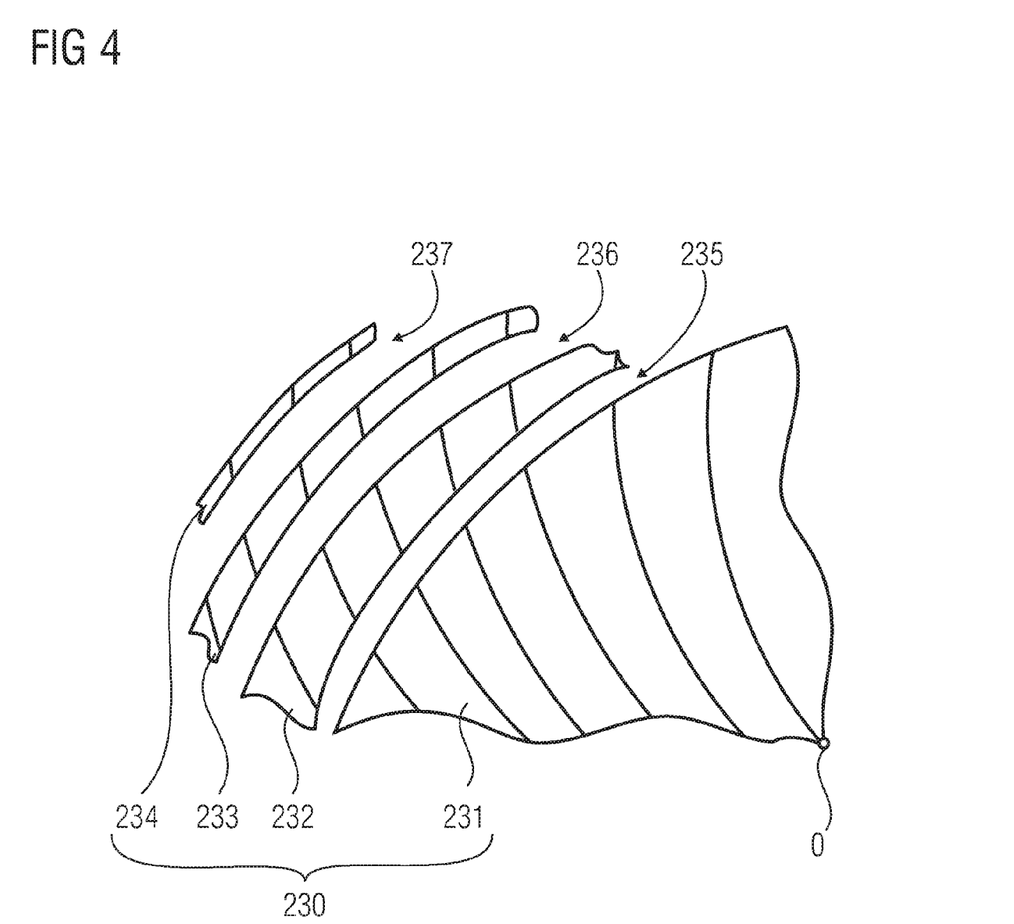
FIG. 4 shows an acoustic coupling layer structure with a Fresnel lens structure.

FIG. 4 shows a possible design of the coupling structure 230, so that a propagation of an acoustic wave between the first and second resonator areas A1 and A2 (being different) of the first and second BAW resonators 110a and 110b can be adapted in as loss-free a manner as possible. FIG. 4 shows a top view (that is perpendicular to the cross-sectional view, as it is shown in FIG. 3) onto the coupling structure 230, wherein only part of the coupling structure 230 can be seen, namely from a center point O of a main region 231, which may be in a center region of the coupling structure 230 from FIG. 3, to an edge region. The coupling structure 230 shown in FIG. 4 is designed such that a first region 232, a second region 233 and a third region 234 are formed in the edge region such that the dimensions from the central point O toward the edge become increasingly smaller. In equal manner, gaps 235, 236, 237 between the main region 231 and the first region 232, between the first region 232 and the second region 233, between the second region 233 and the third region 234 become correspondingly larger away from the central region or the middle point O.

For example, a layer with high acoustic impedance may comprise the design shown in FIG. 4, which thus adapts the different resonator areas among the first BAW resonator 110a and the second BAW resonator 110b and/or correspondingly focuses or defocuses the acoustic wave.

Figure 5:
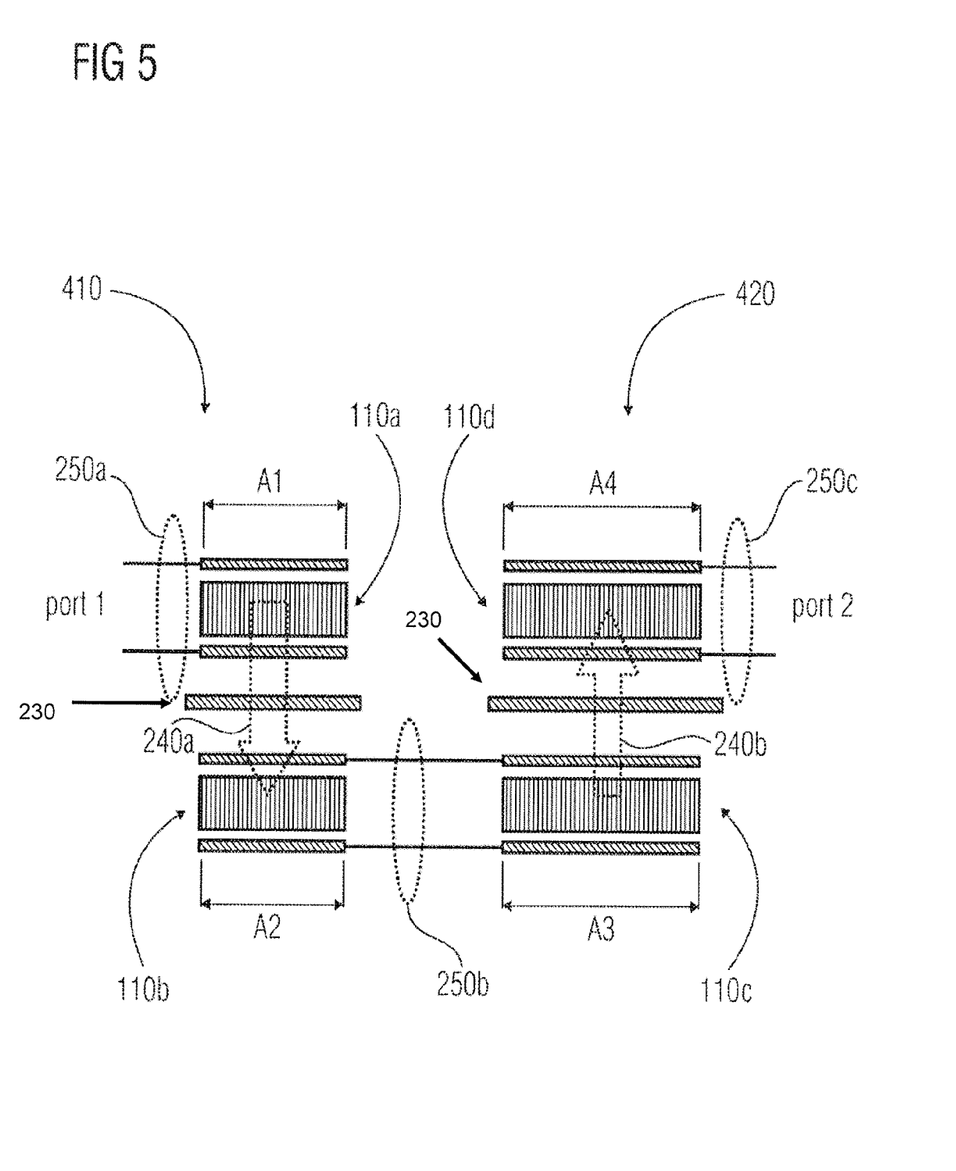
FIG. 5 shows two coupled CRF stages with impedance transformation by deviations in the resonator areas.

FIG. 5 shows an embodiment with a first CRF stage 410 and a second CRF stage 420, which are electrically coupled and elements of each CRF stage were described in more detail at FIG. 3. The embodiment differs from the conventional structure, as it is shown in FIG. 2, in that the first resonator area A1 of the first BAW resonator 110a, the second resonator area A2 of the second BAW resonator 110b, the third resonator area A3 of the third BAW resonator 110c and the fourth resonator area A4 of the fourth BAW resonator 110d are chosen differently. This entails that the impedances of the first BAW resonator 110a and of the second BAW resonator 110b differ from each other, so that an impedance jump occurs in the acoustic transmission of a signal 240a between the first BAW resonator 110a and the second BAW resonator 110b. In similar manner, the impedance of the third BAW resonator 110c is different from the impedance of the fourth BAW resonator 110d as a result of a differently chosen resonator area A3 as compared with the resonator area A4 of the fourth BAW resonator 110d. Accordingly, also an impedance jump occurs in the acoustic transmission 240b from the third BAW resonator 110c to the fourth BAW resonator 110d.

In the embodiment shown in FIG. 5, thus five impedance jumps may occur altogether: a first impedance jump at the electrical coupling 250a (if the electric device being coupled at the first port (port 1) has another impedance than the impedance of the first BAW resonator 110a), a second impedance jump at the acoustic coupling 240a between the first and second BAW resonators 110a and 110b, a third impedance jump at the electric coupling between the second BAW resonator 110b and the third BAW resonator 110c, if the impedance of the second BAW resonator 110b differs from the impedance of the third BAW resonator 110c, e.g., as a result of the differently chosen resonator areas A2 and A3. A fourth impedance jump may occur at the acoustic coupling 240b between the third BAW resonator 110c and the fourth BAW resonator 110d, which have different impedances. Finally, a last impedance jump may occur if an output device, which may be coupled at the second port (port 2), has an output impedance different from the impedance of the fourth BAW resonator 110d. Accordingly, the fifth impedance jump occurs at the electric coupling 250c.

Hence, it is possible that the overall transformation ratio of the impedances from the first port to the second port comprises a ratio of 1:2, for example. This mismatch can thus be evenly distributed across all five couplings or interfaces (250a, 250b, 250c, 240a and 240b). For example, this is the case if an area ratio of the resonator areas of two coupled BAW resonators comprising 1:1.15 is created. For example: A4=1.15*A3=(1.15)2*A2=(1.15)3*A1. Thus, in a rectangular design of the first and second electrodes the edge lengths have a ratio of, for example, 1:1.07. This means that, for a BAW resonator having an edge length of 50 μm, for example, the overhang of the larger resonator over the smaller one on each side is less than 2 μm (about 1.75 μm). With such a small offset, the extension of an usual lateral drop of an acoustic wave is sufficient for a reasonable overlap.

Figure 6:
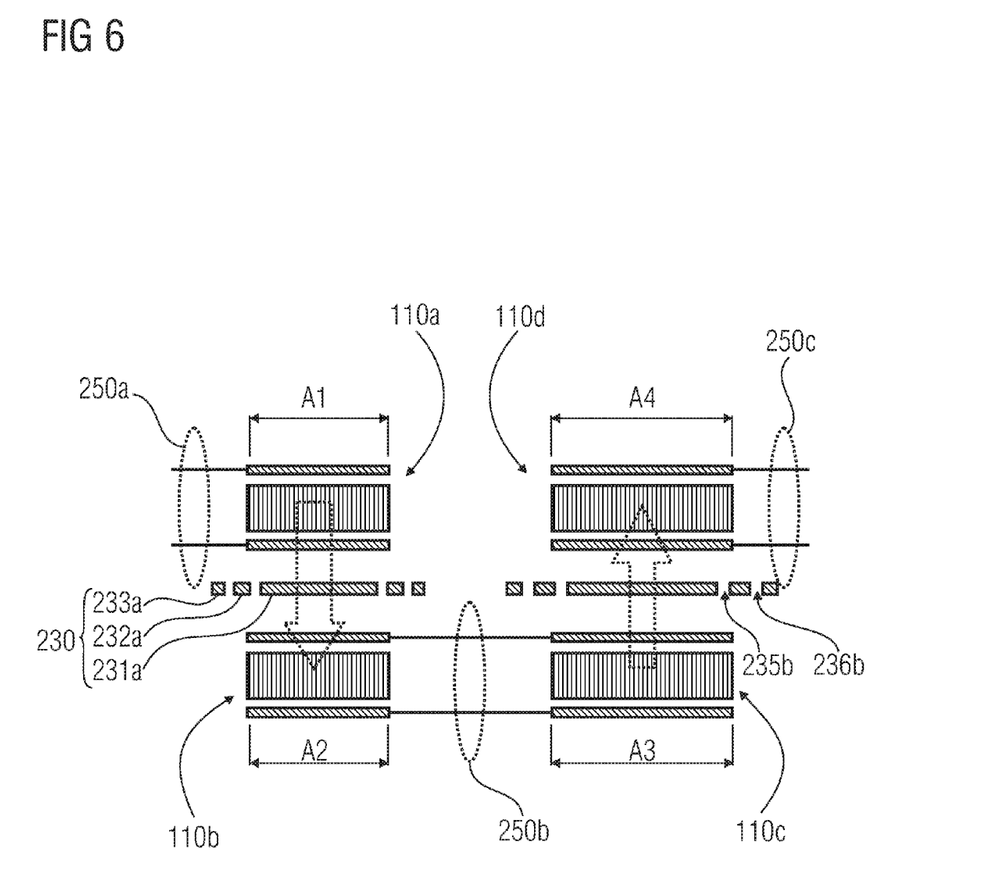
FIG. 6 shows two coupled CRF stages with an acoustic coupling layer structure comprising a Fresnel lens structure.

FIG. 6 shows an embodiment, which differs from the embodiment shown in FIG. 5 by a modified coupling structure 230. Similar to FIG. 5, the embodiment of FIG. 6 shows an example in which four BAW resonators with different impedances that are electrically/acoustically coupled, wherein the different impedances are caused by different resonator areas (elements were described in more detail at FIG. 3).

Particularly if a larger impedance jump is to be overcome by an acoustic coupling, it may be useful and helpful if the coupling structure 230 adapts the acoustic wave to the different resonator areas. For example, the first BAW resonator 110a may have a first resonator area A1, and the second resonator 110b a second resonator area A2, so that A1 and A2 differ from each other such that, during the transmission of the acoustic signal from the first BAW resonator 110a to the second BAW resonator 110b, greater (signal) losses occur. In such a case, the coupling structure 230 between the first BAW resonator 110a and the second BAW resonator 110b may be designed in the form of a Fresnel lens or a Fresnel lens structure. As a result of diffraction and scattering effects, a propagating acoustic wave or a wave front can be focused or defocused therewith correspondingly. This lens structure thus enables also greater impedance jumps as a result of greater area differences to be realized or bridged.

In the embodiment shown in FIG. 6, the coupling structure 230 comprises two coupling layers 231a and 233a with low acoustic impedance, between which a layer 232a with high acoustic impedance is located. The Fresnel lens can be formed such that the layer with higher acoustic impedance comprises an edge region in which the at least one layer with high acoustic impedance comprises openings 235b, 236b . . . with increasing size toward the edge. Hence, the coupling layer with high acoustic impedance is structured laterally such that it is surrounded by rings or points, the sizes of which decrease toward the outside. An example for a ring-shaped design is shown in FIG. 4, whereas in a point-shaped design the regions 232, 233 and 234 may have a circular structure, the radius of which decreases with increasing distance at the point O. If the coupling structure 230 comprises further layers with high acoustic impedance, each of these further layers with high acoustic impedance may have the Fresnel-like structure in its edge region, wherein positioning of the opening regions 235b, 236b, . . . may take place such that a loss in the signal transmission between two acoustically coupled BAW resonators is minimized.

Figure 7:
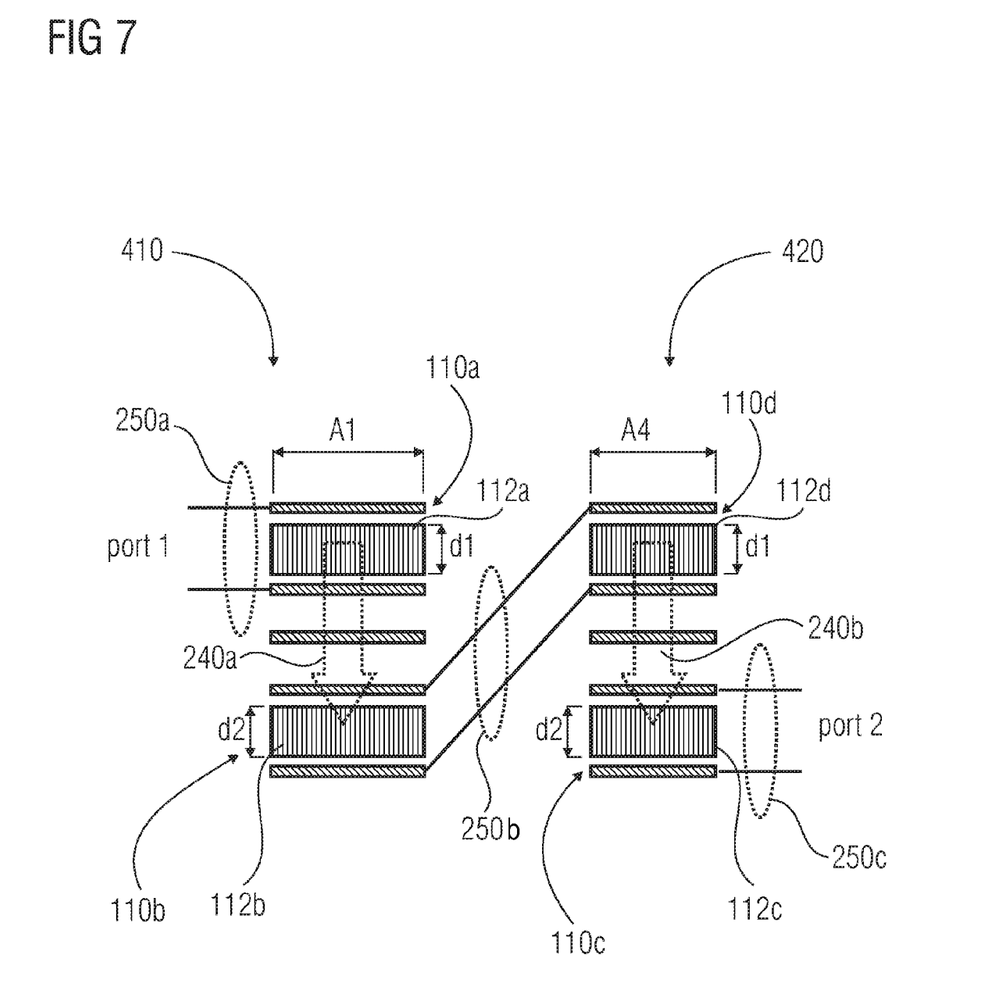
FIG. 7 shows two coupled CRF stages comprising BAW resonators with different piezoelectric layer thicknesses.

FIG. 7 shows an embodiment of the present invention in which the BAW resonators of the first CRF stage 410, the first BAW resonator 110a and the second BAW resonator 110b, have equal resonator area A1, and the BAW resonators of the second CRF stage 420, the third BAW resonator 110c and the fourth BAW resonator 110d, also have equal resonator area A4. The first BAW resonator 110a and the second BAW resonator 110b, however, comprise a different layer thickness of the piezoelectric layer. The layer thickness d1 of the first piezoelectric layer 112a differs from the layer thickness d2 of the second piezoelectric layer 112b of the second BAW resonator 110b. In the present case, the layer thickness d2 of the second BAW resonator 110b is greater than the layer thickness d1 of the first BAW resonator 110a. Likewise, the layer thickness d1 of the piezoelectric layer 112d of the fourth BAW resonator 110d is greater than the layer thickness d2 of the piezoelectric layer 112c of the third BAW resonator 110c. In contrast to the aforementioned embodiments, the second and fourth BAW resonators 110b and 110d are here electrically connected.

The different layer thicknesses of the piezoelectric layers result in the fact that the impedances of the first BAW resonator 110a and the second BAW resonator 110b also are different, and the impedance of the fourth BAW resonator 110d also is different as compared with the impedance of the third BAW resonator 110c. Since the resonator areas A1 of the first and second BAW resonators 110a and 110b also differ from the resonator area A4 of the third and fourth BAW resonators 110c and 110d, the impedances of all BAW resonators differ from each other. Thus, it is again possible to realize five impedance jumps altogether. A first impedance jump may be realized at the first port (port 1), as far as the impedance of the first BAW resonator 110a differs from an impedance of an upstream device. A second impedance jump occurs at the transition of the acoustic signal from the first BAW resonator 110a to the second BAW resonator 110b, and the second impedance jump is bridged by the acoustic coupling 240a. A third impedance jump occurs at the electric coupling of the second BAW resonator 110b to the fourth BAW resonator 110d, wherein the different impedances are caused due to the different resonator areas A1 and A4. A fourth impedance jump occurs at the transition of the acoustic signal from the fourth BAW resonator 110d to the third BAW resonator 110c and is bridged by the acoustic coupling 240b.

Finally, a fifth impedance jump is possible if the impedance of the third BAW resonator 110c differs from an impedance of a downstream device (not shown in the FIG. 7).

In the embodiment shown in FIG. 7, thus, an input signal may, for example, be present at the first port, and the first port is connected to the two electrodes of the first BAW resonator 110a. The first BAW resonator 110a is acoustically coupled to the second BAW resonator 110b via the acoustic coupling 240a. The second BAW resonator 110b is coupled to the fourth BAW resonator 110d electrically, for example, by the first electrode of the second BAW resonator 110b being electrically connected to the first electrode of the fourth BAW resonator 110d and the second electrode of the second BAW resonator 110b being electrically connected to the second electrode of the fourth BAW resonator 110d. The fourth BAW resonator 110d is acoustically coupled to the third BAW resonator 110c via the acoustic coupling 240b, and the electrodes of the third BAW resonator 110c comprise the two terminals of the second port in this embodiment. In a different notation the counting of the BAW resonators can follow the signal path, i.e., the fourth and third BAW resonators 110c and 110d are denoted oppositely (the third BAW resonator 110c is the upper and the fourth BAW resonator 110d is the lower one).

Thus, the embodiment of FIG. 7 shows two acoustic couplings, a first acoustic coupling 240a between the first BAW resonator 110a and the second BAW resonator 110b and a second acoustic coupling 240b between the fourth BAW resonator 110d and the third BAW resonator 110c. Moreover, the embodiment of FIG. 7 comprises three electric couplings, a first electric coupling 250a between the first port and the two electrodes of the first BAW resonator 110a, a second electric coupling 250b between the two electrodes of the second BAW resonator 110b and the two electrodes of the fourth BAW resonator 110d, and finally a third electrical coupling 250c between the two electrodes of the third BAW resonator 110c and the two terminals of the second port.

The connection thus obtained may also be represented in the signal path as follows:

Signal In→Top R1→Bottom R1→Top R2→Bottom R2→Signal Out

The choice of the input and output signals (signal in and signal out), however, are purely arbitrary, and in further embodiments an input signal may also be present at the second port and the output signal at the first port.

Figure 8:
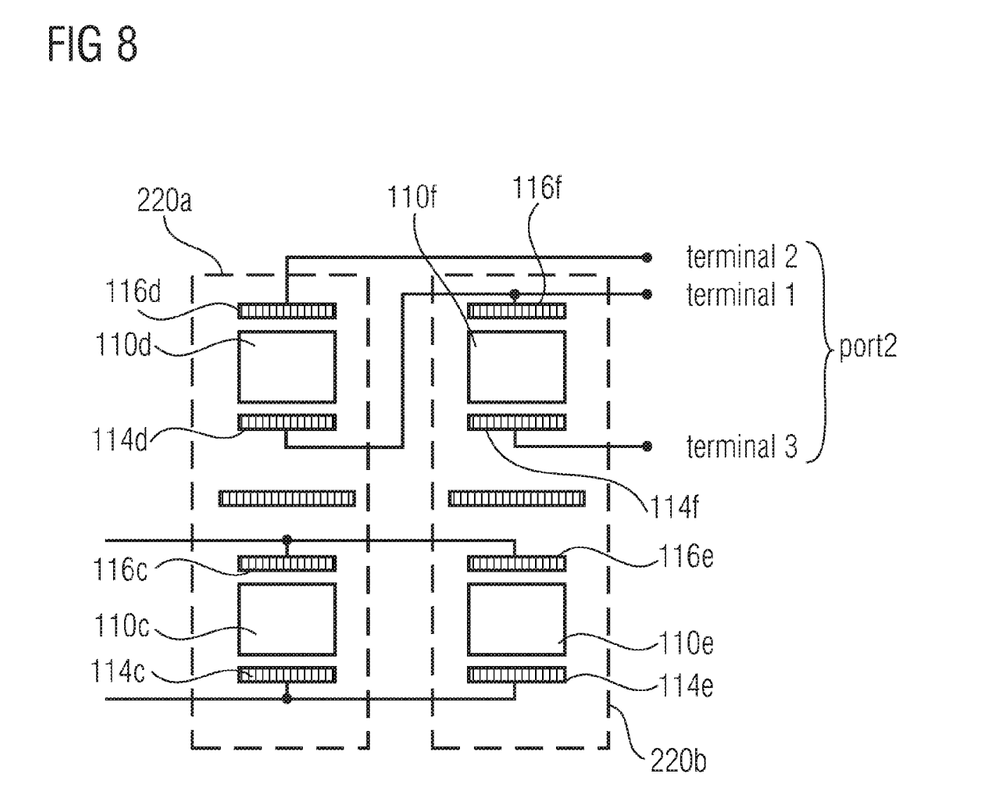
FIG. 8 shows a single-to-balanced conversion by means of two electrically coupled CRF devices.

FIG. 8 shows a possible realization for a single-to-balanced mode conversion of an input to an output signal. For example, the second CRF stage 420 may here be replaced by two CRF stages 220a and 220b, the second CRF stage 220a comprising the third and fourth BAW resonators 110c and 110d, the additional CRF stage 220b comprising a fifth and a sixth BAW resonator 110e and 110f. The third and fifth BAW resonators 110c and 110e are connected in parallel, e.g., by connecting the first electrodes 114c, 114e and by connecting the second electrodes 116c, 116e of the third and fifth BAW resonators 110c and 110e with each other. On the other hand, the first electrode 114d of the fourth BAW resonator 110d is connected with a second electrode 116f of the sixth BAW resonator 110f providing a terminal 1 (e.g., ground) for port 2. The remaining electrodes, the second electrode of the fourth BAW resonator 110d and the first electrode 114f of the sixth BAW resonator 110f provide a terminal 2 and terminal 3 of port 2, on which a signal will be phase shifted (by 180°) relative to each other. Of course, also the first CRF stage 410 can be replaced by two CRFs, in which the corresponding BAW resonators are connected in the same way as shown here and thereby providing a balance signal also at port 1.

In the embodiments thus obtained, the matching sites of the circuits, that is the position in the signal path at which the signal propagates from one to the next functional unit, are designed, in terms of circuit technology, so that no or an impedance jump as small as possible is overcome. This adaptation of the impedances to each other is also referred to as "matching". All such sites are drawn in dashed lines in the FIGS. 2-7, circles for electric matching (or coupling) and arrows for acoustic matching (or coupling).

In conventional devices, as the one shown in FIG. 2, for overcoming the transformation from an input impedance Z0 to an output impedance Z1, three matching sites are present and can be optimized correspondingly:

input impedance Z0 from Top R1,
Bottom R1 to Bottom R2,
Top R2 to output impedance Z1.

For example, if an impedance transformation from 50 to 100 ohms is to be realized, this corresponds to a transformation ratio of 1:2, and hence the factor of 2 is distributed to three matching sites in the conventional connection of FIG. 2. If the three sites are denoted by A, B, C and/or the three impedance ratios (or jumps) a1, a2 and a3 are to be designated, it follows:

$$Z0/Z1 = Z0/ZA * ZA/ZB * ZB/Z1 = a1*a2*a3 = 2.$$

Equal distribution is one possibility, so that $$a1 = a2 = a3 = \sqrt[3]{2}$$

and thus a1~1.26. But this needs not be an optimum solution, and redistribution may take place instead, wherein the exact ratios can be determined by device simulation.

The distribution to three sites is still possible technically, but the overall performance of the filter will already suffer noticeably with reference to the insertion loss and return loss signals. In the configuration, as it is shown in FIG. 2, the acoustic interface cannot be used for impedance matching, because the signal passes through the two resonators R1 (the first CRF stage 310) and R2 (the second CRF stage 320) in reverse direction each. Accordingly, each transformation of R1, e.g., from the first BAW resonator 110a to the second BAW resonator 110b, would again be compensated for by R2 by the reverse transformation in the second CRF stage 320, e.g., from the third BAW resonator 110c to the fourth BAW resonator 110d.

In the crossed-out circuit shown in FIG. 7, it can be seen that the two resonators R1 and R2 are passed through in the same direction, so that the acoustic impedance transformation through the resonators can be used here. Thus, five interfaces (two acoustic ones 240a and 240b and three electric ones 250a, 250b and 250c) are available for impedance matchings here. The flexibility gained therewith can be used to meet the requirements for impedance transformations from Z0 to Z1, for example, at minimum performance losses. In the same example as above (50 ohms to 100 ohms), an equal distribution of the mismatch corresponds to $$(a1)5 = 2,$$

and hence a mismatch of $a1 \sim \sqrt[5]{2}$ or about 1:1.15 at every impedance jump occurs. This leads to significantly less performance degradations than in the above-mentioned 1:1.26 (due to the above mentioned non-linearity).

If the layer thicknesses of the piezoelectric layers of the first and fourth BAW resonators 110a and 110d can be chosen differently, the crossing-out, that is electrically connecting the second BAW resonator 110b to the fourth BAW resonator 110d (in FIG. 7), can be omitted. In such a case, like also in the circuit, as it is shown in FIG. 2, an electrical connection of the second BAW resonator 110b with the third BAW resonator 110c can be realized. In order to avoid the compensation effect, as it has been described above, however, it is necessary that the layer thickness d4 of the piezoelectric layer of the fourth BAW resonator 110d is greater than the piezoelectric layer d2 of the third BAW resonator 110c, and hence the layer thickness d4 of the fourth BAW resonator 110d is also greater than the layer thickness d1 of the first BAW resonator 110a. Layer thicknesses of the piezoelectric layer thus chosen would have the advantage that vias could be omitted, which would simplify the processing.

Apart from the variation of the layer thicknesses of the piezoelectric layers and the variations of the resonator areas of the individual BAW resonators, it is also possible to vary the impedances of the BAW resonators through various materials. A simple possibility, for example, is using piezoelectric layers with different $\in$ values. In particular, if the BAW resonators are arranged at different sites along two piezoelectric layers arranged on top of each other, it is possible to use different materials for the upper and lower piezoelectric layers.

In further embodiments, at least one of the first, second, third, fourth and fifth electrodes comprise an assembly of layers with materials of different acoustic impedances as, for example, tungsten (W), molybdenum (Mo), palladium (Pa). Especially Mo and W comprise a high conductivity and, moreover, are compatible with CMOS technology. A principle benefit of constructing electrodes comprising a plurality of layers is a higher electromechanical coupling coefficient of the resulting resonator enabling larger filter bandwidths.

In general, the piezoelectric layers can comprise one or more different layers, of which at least one exhibits piezoelectric activity. The other layers between the top and bottom electrode, that sandwich the piezoelectric layer, can be non-piezoelectric-active dielectric or other layers to achieve special performance effects like temperature coefficient compensation or to facilitate manufacturing like adhesion layers. In addition, the other layers are typically thin when compared to "real" piezoelectric (active) layer.

Finally, possible materials for layers with high acoustic impedance comprise, for example: W, Mo, Pt, Ta, TiW, TiN, Ir, WSi, Au, $Al_2O_3$, SiN, $Ta_2O_5$ and zirconium-oxide, wherein the last four are dielectrical materials. Possible materials for the piezoelectric layers are, for example, AlN, ZnO, PZT and $LiNbO_3$. A material for lower acoustic impedance is, for example, aluminum.

Further embodiments comprise also a substrate, on which the first and second CRF 410 and 420 are formed, an acoustic mirror and a further acoustic mirror. The acoustic mirror is formed between the substrate and the second BAW resonator 110b and the further acoustic mirror is formed between the substrate and the third BAW resonator 110c. The acoustic mirror and the further acoustic mirror can comprise a layer assembly of alternating materials of high and low acoustic impedances.

The aforementioned Fresnel lens or more general a means for adapting a wave front of an acoustic wave propagating between BAW resonators can comprise a layer of high acoustic impedance with openings of varying size, so that a propagating acoustic wave is focused or defocused.

Embodiments comprise also a method for matching impedances of BAW resonators, which are electrically connected and/or acoustically coupled and comprise a first and second port. The impedances will obey predetermined ratios, which can be chosen such that the insertion loss between the first and second port is minimized. In further embodiments the ratio of a first to a second impedance equals the ratio of the second to a third impedance equals the ratio of the third to a fourth impedance. According to the method the first, second, third and fourth impedances can also be adjusted by choosing a layer thickness of the piezoelectric layer forming the first, second, third and fourth BAW resonators 110a-110d and by choosing resonator areas of the first, second, third and fourth BAW resonators 110a-110d.

What is claimed is:

1. An apparatus, comprising:
a first bulk acoustic wave (BAW) device comprising: a first BAW resonator comprising a first piezoelectric layer sandwiched between a first and a second electrode over a first resonator area, wherein the first piezoelectric layer comprises a first layer thickness, the first BAW resonator comprising a first impedance;
a second BAW device comprising: a second BAW resonator comprising a second piezoelectric layer sandwiched between a first and a second electrode layer over a second resonator area, wherein the second piezoelectric layer comprises a second layer thickness, the second BAW resonator comprising a second impedance, that is different from the first impedance; and
an acoustic coupling structure disposed between the first BAW device and the second BAW device, the acoustic coupling structure comprising a plurality of layers of alternating materials of high and low acoustic impedances, wherein the first resonator area differs from the second resonator area.

2. The apparatus according to claim 1, wherein both the first and second layer thicknesses differ from each other.

3. The apparatus according to claim 1, wherein an acoustic wave propagating between the first and second BAW resonators comprises a characteristic length with which an amplitude of the acoustic wave falls off laterally outside the resonator areas to a predetermined fraction, and wherein the difference between the first and second resonator areas is less than a factor times a product of the characteristic length and the circumference of the first resonator area, and the factor is equal to 10, 5 or 3.

4. The apparatus according to claim 1, wherein the first BAW device is disposed over the acoustic coupling structure, and the second BAW device is disposed beneath the acoustic coupling structure.

5. The apparatus according to claim 4, wherein at least one of the layers of the coupling structure with materials of high acoustic impedance comprise a Fresnel lens structure configured to adapt a wave front of an acoustic wave to different resonator areas.

6. The apparatus according to claim 1, further comprising a substrate and an acoustic mirror disposed beneath the second BAW device, and wherein the acoustic mirror comprises a layer assembly of alternating materials of high and low acoustic impedances.

7. An apparatus, comprising:
a first means for BAW filtering a signal comprising a first impedance; and
a second means for BAW filtering a signal comprising a second impedance; and
an acoustic coupling structure disposed between the first means for BAW filtering and the second means for BAW filtering, the acoustic coupling structure comprising a plurality of layers of alternating materials of high and low acoustic impedances, wherein at least one of the layers of the acoustic coupling structure with materials of high acoustic impedance comprise a Fresnel lens structure.

8. A bulk acoustic wave (BAW) device, comprising:
a first BAW resonator comprising a first piezoelectric layer with a first thickness, the first BAW resonator being electrically connected to a first port;
a second BAW resonator comprising a second piezoelectric layer with a second thickness, the second BAW resonator being acoustically coupled to the first BAW resonator;
an acoustic coupling structure disposed between the first BAW resonator and the second BAW resonator, the acoustic coupling structure comprising a plurality of layers of alternating materials of high and low acoustic impedance, wherein at least one of the layers of the acoustic coupling structure with materials of high acoustic impedance comprise a Fresnel lens structure;
a third BAW resonator comprising a third piezoelectric layer with a third thickness, the third BAW resonator being electrically connected to the second BAW resonator; and
a fourth BAW resonator comprising a fourth piezoelectric layer with a fourth thickness, the fourth BAW resonator being acoustically coupled to the third BAW resonator and being electrically connected to a second port,
wherein each BAW resonator comprises a piezoelectric layer sandwiched between a first and a second electrode, and wherein the first thickness differs from the second thickness.

9. The BAW device according to claim 8, wherein the first BAW resonator comprises a first impedance, the second BAW resonator comprises a second impedance, the third BAW resonator comprises a third impedance and the fourth BAW resonator comprises a fourth impedance, and wherein the ratios of the first, second, third and fourth impedances obey predetermined values.

10. The BAW device according to claim 9, wherein the ratio of the first and the second impedances equals the ratio of the second and third impedances and equals the ratio of the third and fourth impedances.

11. A bulk acoustic wave (BAW) device as claimed in claim 8, further comprising another acoustic coupling structure, the other acoustic coupling structure being disposed between the third BAW resonator and the fourth BAW resonator, wherein the other acoustic coupling structure comprises a plurality of layers of alternating materials of high and low acoustic impedance.

12. The BAW device according to claim 8,
wherein the first BAW resonator comprises a first resonator area, over which the first piezoelectric layer is sandwiched between the first and second electrode,
wherein the second BAW resonator comprises a second resonator area, over which the second piezoelectric layer is sandwiched between the first and second electrode of the second BAW resonator,
wherein the third BAW resonator comprises a third resonator area, over which the third piezoelectric layer is sandwiched by the first and the second electrode of the third BAW resonator, and
wherein the fourth BAW resonator comprises a fourth resonator area, over which the fourth piezoelectric layer is sandwiched by the first and second electrode of the fourth BAW resonator.

13. The BAW device according to claim 12, wherein the first and second resonator areas are substantially the same, and the third and fourth resonator areas are substantially the same.

14. The BAW device according to claim 13, wherein the first layer thickness is substantially the same as the third layer thickness and wherein the second layer thickness is substantially the same as the fourth layer thickness.

15. The BAW device according to claim 14,
wherein the first and the third piezoelectric layers are part of a common piezoelectric layer and wherein second and the fourth piezoelectric layers are part of a further common piezoelectric layer,
wherein the first BAW resonator and the third BAW resonator are formed at different sites of a common piezoelectric layer, and
wherein the second BAW resonator and the fourth BAW resonator are formed at different sites of a further common piezoelectric layer.

16. The BAW device according to claim 15, wherein the common piezoelectric layer and/or the further common piezoelectric layer comprise an opening through which the second BAW resonator and the third BAW resonator are electrically connected.

17. The BAW device according to claim 16, wherein the common piezoelectric layer comprises the first thickness, the further common piezoelectric layer comprises the second thickness, and wherein the first resonator area differs from the third resonator area.

18. A BAW device, comprising:
a first port with a first and second terminal;
a second port with a first and second terminal;
a first BAW resonator comprising a first piezoelectric layer sandwiched between a first and second electrode over a first resonator area;
a second BAW resonator comprising a second piezoelectric layer sandwiched between a first and second electrode over a second resonator area being different from the first resonator area;
an acoustic coupling structure disposed between the first BAW resonator and the second BAW resonator, the acoustic coupling structure comprising a plurality of layers of alternating materials of high and low acoustic impedance;
a third BAW resonator comprising a third piezoelectric layer sandwiched between a first and second electrode over a third resonator area; and
a fourth BAW resonator comprising a fourth piezoelectric layer sandwiched between a first and a second electrode over a fourth resonator area,
wherein the first and second BAW resonators are acoustically coupled, and wherein the third and fourth BAW resonators are acoustically coupled, and wherein the first BAW resonator is electrically coupled to the first port, the fourth BAW resonator is electrically coupled to the second port and wherein the second and third BAW resonators are electrically connected.

19. The BAW device according to claim 18, wherein the first and fourth BAW resonators are formed at different sites of a common piezoelectric layer, and wherein the second and third BAW resonators are formed at different sites of a further common piezoelectric layer.

20. The BAW device according to claim 19, wherein the fourth resonator area differs from the third resonator area and/or the third resonator area differs from the second resonator area.

21. The BAW device according to claim 18, wherein the coupling structure is disposed beneath the first BAW resonator and above the second BAW resonator, and the BAW device further comprises another coupling structure disposed between the third BAW resonator and the fourth BAW resonator, wherein the coupling structure defines an acoustic coupling between the first and second BAW resonators and the other coupling structure defines an acoustic coupling between the third and fourth BAW resonators.

22. The BAW device according to claim 21, wherein at least one layer of a layer assembly with materials of high acoustic impedance of the first and the second coupling structure comprise a Fresnel lens structure in order to adapt a propagating acoustic wave between the first and second BAW resonators and/or between the third and fourth BAW resonators to different resonator areas.

* * * * *